(12) United States Patent
Suemitsu et al.

(10) Patent No.: US 10,699,882 B2
(45) Date of Patent: Jun. 30, 2020

(54) SEMICONDUCTOR MANUFACTURING APPARATUS AND METHOD OF MANUFACTURING SEMICONDUCTOR DEVICE

(71) Applicant: TOSHIBA MEMORY CORPORATION, Minato-ku (JP)

(72) Inventors: Ryo Suemitsu, Yokkaichi (JP); Takashi Ohashi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/045,789

(22) Filed: Jul. 26, 2018

(65) Prior Publication Data

US 2019/0259582 A1  Aug. 22, 2019

(30) Foreign Application Priority Data

Feb. 22, 2018 (JP) .................................. 2018-029856

(51) Int. Cl.
*H01J 37/32* (2006.01)
*H01L 21/263* (2006.01)
(Continued)

(52) U.S. Cl.
CPC ........ *H01J 37/32669* (2013.01); *C23C 16/50* (2013.01); *H01J 37/32568* (2013.01);
(Continued)

(58) Field of Classification Search
CPC ........... H01J 37/32669; H01J 37/32568; H01J 37/32715; H01J 2237/334; H01L 21/263; H01L 21/67069
See application file for complete search history.

(56) References Cited

U.S. PATENT DOCUMENTS 5,345,145 A *  9/1994 Harafuji ............ H01J 37/32165
                                                    315/111.41
6,528,751 B1    3/2003 Hoffman et al.
(Continued)

FOREIGN PATENT DOCUMENTS

JP          62-210622       9/1987
JP          2011-18684      1/2011
(Continued)

*Primary Examiner* — Kyoung Lee
*Assistant Examiner* — Christina A Sylvia
(74) *Attorney, Agent, or Firm* — Oblon, McClelland, Maier & Neustadt, L.L.P.

(57) ABSTRACT

In one embodiment, a semiconductor manufacturing apparatus includes a treatment chamber configured to treat a substrate with plasma, a first annular coil configured to generate a first magnetic field to be applied to the plasma, and a second annular coil configured to generate a second magnetic field to be applied to the plasma. The apparatus further includes a first electric current supplying module configured to supply, to the first annular coil, a first electric current flowing in a first direction, and cause the first annular coil to generate the first magnetic field. The apparatus further includes a second electric current supplying module configured to supply, to the second annular coil, a second electric current flowing in a second direction that is different from the first direction, and cause the second annular coil to generate the second magnetic field.

4 Claims, 4 Drawing Sheets

(51) Int. Cl.
*C23C 16/50* (2006.01)
*H01L 21/67* (2006.01)

(52) U.S. Cl.
CPC ...... *H01L 21/263* (2013.01); *H01J 37/32715* (2013.01); *H01J 2237/334* (2013.01); *H01L 21/67069* (2013.01)

(56) References Cited

U.S. PATENT DOCUMENTS

| | | | | |
|---|---|---|---|---|
| 2003/0071035 | A1* | 4/2003 | Brailove | H05B 6/108 219/672 |
| 2004/0182516 | A1* | 9/2004 | Lindley | H01J 37/32623 156/345.46 |
| 2008/0297288 | A1* | 12/2008 | Irwin | H01F 7/1615 335/254 |
| 2013/0105086 | A1* | 5/2013 | Banna | H05H 1/46 156/345.38 |
| 2015/0332898 | A1 | 11/2015 | Yokota et al. | |
| 2017/0004956 | A1* | 1/2017 | Yasuda | H05H 1/46 |

FOREIGN PATENT DOCUMENTS

| | | |
|---|---|---|
| JP | 4769586 | 9/2011 |
| JP | 2015-201558 | 11/2015 |
| JP | 2015-220352 | 12/2015 |

\* cited by examiner

ABSTRACT# SEMICONDUCTOR MANUFACTURING APPARATUS AND METHOD OF MANUFACTURING SEMICONDUCTOR DEVICE

CROSS REFERENCE TO RELATED APPLICATION

This application is based upon and claims the benefit of priority from the prior Japanese Patent Application No. 2018-029856, filed on Feb. 22, 2018, the entire contents of which are incorporated herein by reference.

FIELD

Embodiments described herein relate to a semiconductor manufacturing apparatus and a method of manufacturing a semiconductor device.

BACKGROUND

In a semiconductor manufacturing apparatus including a coil that generates a magnetic field to be applied to plasma, the magnetic field is generated by supplying an electric current to the coil. In this case, when the relationship between the electric current and the magnetic field of the coil is changed due to the hysteresis of an electromagnet provided with the coil, there is caused a problem that a desired magnetic field cannot be applied to the plasma.

DETAILED DESCRIPTION

Embodiments will now be explained with reference to the accompanying drawings.

In one embodiment, a semiconductor manufacturing apparatus includes a treatment chamber configured to treat a substrate with plasma, a first annular coil configured to generate a first magnetic field to be applied to the plasma, and a second annular coil configured to generate a second magnetic field to be applied to the plasma. The apparatus further includes a first electric current supplying module configured to supply, to the first annular coil, a first electric current flowing in a first direction, and cause the first annular coil to generate the first magnetic field. The apparatus further includes a second electric current supplying module configured to supply, to the second annular coil, a second electric current flowing in a second direction that is different from the first direction, and cause the second annular coil to generate the second magnetic field.

First Embodiment

Figure 1:
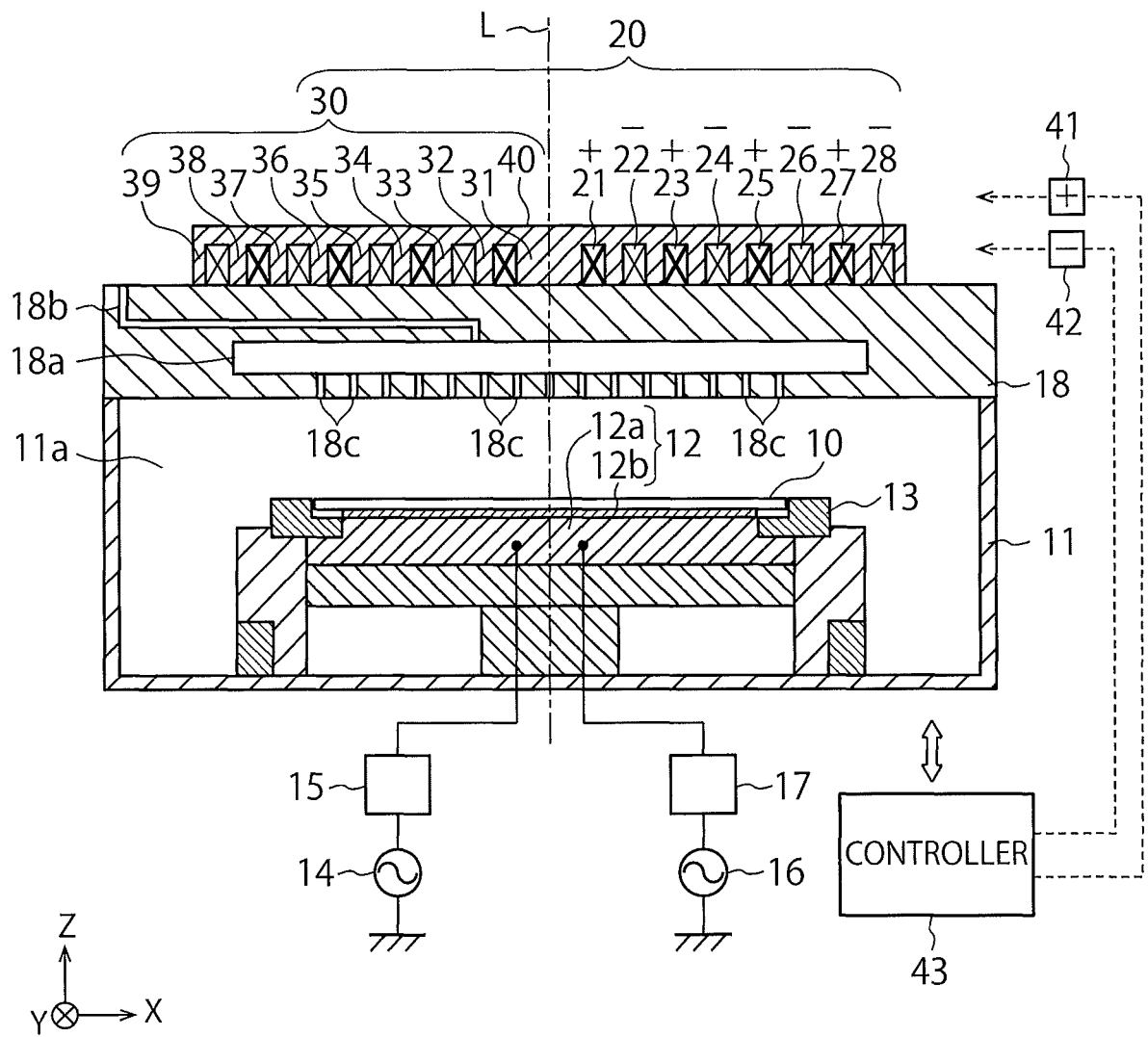
FIG. 1 is a cross sectional view schematically showing the configuration of a semiconductor manufacturing apparatus of a first embodiment.

FIG. 1 is a cross sectional view schematically showing the configuration of a semiconductor manufacturing apparatus of a first embodiment.

The semiconductor manufacturing apparatus in FIG. 1 is a plasma treatment apparatus, such as a dry etching apparatus or a plasma CVD (chemical vapor deposition) apparatus, for treating a wafer 10 by using plasma. The semiconductor manufacturing apparatus in FIG. 1 includes a treatment chamber 11, a placement stage 12, a dummy ring 13, a first high-frequency power supply 14, a first matching device 15, a second high-frequency power supply 16, a second matching device 17, and an upper electrode 18.

The wafer 10 is, for example, a semiconductor wafer such as a silicon wafer, and various films may be formed on the semiconductor wafer. The wafer 10 is one example of a substrate. FIG. 1 shows an X direction and a Y direction which are parallel with a surface of the wafer 10 and which are orthogonal to each other, and a Z direction which is orthogonal to the surface of the wafer 10. Herein, the +Z direction is defined as the upward direction and the −Z direction is defined as the downward direction. However, the −Z direction may coincide or may not coincide with the gravity direction.

The treatment chamber 11 is a chamber for accommodating the wafer 10 to be treated with plasma. The placement stage 12 is provided inside the treatment chamber 11, and includes a base stage 12a for supporting the wafer 10, and an electrostatic chuck 12b for suctioning the wafer 10 by an electrostatic force. The placement stage 12 also functions as a lower electrode for plasma treatment. The dummy ring 13 is provided on the circumferential edge of the upper surface of the base stage 12a in the treatment chamber 11, and is provided at a position, on the base stage 12a, so as to surround the wafer 10.

After being carried into the treatment chamber 11, the wafer 10 is placed on the base stage 12a and is suctioned by the electrostatic chuck 12b. In this state, the central axis L of the wafer 10 substantially coincides with the central axis of the base stage 12a or the electrostatic chuck 12b.

The first high-frequency power supply 14 is connected to the placement stage 12 via the first matching device 15, and generates high frequency power for plasma generation. The first high-frequency power supply 14 generates high frequency power of 100 MHz, for example. The first matching device 15 includes a circuit for matching between the output impedance and the input impedance of the first matching device 15.

The second high-frequency power supply 16 is connected to the placement stage 12 via the second matching device 17, and generates high frequency power (bias power) for drawing ions. The second high-frequency power supply 16 generates high frequency power of a lower frequency than the first high-frequency power supply 14. For example, the second high-frequency power supply 16 generates high frequency power of 3.2 MHz. The second matching device 17 includes a circuit for matching between the output impedance and the input impedance of the second matching device 17.

The upper electrode 18 is provided inside the treatment chamber 11, and faces the placement stage 12 across a treatment space 11a of the treatment chamber 11. The central axis of the upper electrode 18 substantially coincides with the central axis of the base stage 12a or the electrostatic chuck 12b. The upper electrode 18 also functions as a shower head that introduces treatment gas, in a shower-like state, for treating the wafer 10 into the treatment space 11a. The upper electrode 18 includes a buffer chamber 18a in which the treatment gas is stored, a gas line 18b through which the treatment gas is supplied into the buffer chamber 18a, and a plurality of gas holes 18c through which the treatment gas is supplied from the buffer chamber 18a to the treatment space 11a.

The first and second high-frequency power supplys 14, 16 supply high frequency power between the upper electrode 18 and the placement stage 12 (the lower electrode) so that plasma is generated from the treatment gas in the treatment chamber 11. Consequently, the wafer 10 is treated with the plasma. For example, a film is formed on the wafer 10, or a film on the wafer 10 is etched.

The semiconductor manufacturing apparatus in FIG. 1 further includes an electromagnet 20 above the upper electrode 18. The electromagnet 20 includes annular coils 21 to 28 each having an annular shape, and a core member 30 formed of a magnetic material. The core member 30 is formed of a columnar part 31 having a columnar shape, cylindrical parts 32 to 39 each having a cylindrical shape, and a base part 40 having a disk shape.

The annular coils 21 to 28 are disposed adjacent to each other above the upper electrode 18. The annular coils 21 to 28 of the present embodiment are disposed in a concentric circle shape. The central axes of the annular coils 21 to 28 substantially coincide with the central axes of the base stage 12a, the electrostatic chuck 12b, and the upper electrode 18. When electric current flows through the annular coils 21 to 28, magnetic fields are generated around the annular coils 21 to 28.

In the present embodiment, magnetic fields are generated in the treatment space 11a by the annular coils 21 to 28, and the magnetic fields are applied to plasma in the treatment space 11a. As a result, the orbits of electrons and ions in the plasma can be controlled so that the distribution of plasma density in the treatment space 11a can be controlled. The wafer 10 inside the treatment chamber 11 is treated with this plasma.

The columnar part 31 is disposed inside the annular coil 21. The cylindrical part 32 is disposed between the annular coil 21 and the annular coil 22. The cylindrical part 33 is disposed between the annular coil 22 and the annular coil 23. Similarly, the cylindrical parts 34 to 38 are disposed between the adjacent annular coils. The cylindrical part 39 is disposed so as to surround the annular coil 28. The base part 40 is disposed so as to cover the upper surfaces of the annular coils 21 to 28. The core member 30 of the present embodiment is formed of a ferromagnetic material, and exhibits hysteresis regarding the magnetism.

The semiconductor manufacturing apparatus in FIG. 1 further includes a first electric current supplying module 41, a second electric current supplying module 42, and a controller 43.

The first electric current supplying module 41 supplies a first electric current to first annular coils among the annular coils 21 to 28. In the present embodiment, the first electric current flows in a clockwise direction (a normal direction) when viewed from +Z direction. The first annular coils through which the first electric current flows are the annular coils 21, 23, 25, 27. Accordingly, a first magnetic field (a normal magnetic field) is generated around the first annular coils, and the first magnetic field is applied to the plasma in the treatment chamber 11. The clockwise direction is an example of a first direction. The reference signs "+" given to the annular coils 21, 23, 25, 27 in FIG. 1 denote that these annular coils are the first annular coils.

The second electric current supplying module 42 supplies a second electric current to second annular coils among the annular coils 21 to 28. In the present embodiment, the second electric current flows in a counterclockwise direction (a reverse direction) when viewed from the +Z direction. The second annular coils through which the second electric current flows are the annular coils 22, 24, 26, 28. Accordingly, a second magnetic field (a reverse magnetic field) is generated around the second annular coils, and the second magnetic field is applied to the plasma in the treatment chamber 11. The counterclockwise direction is an example of a second direction. The reference signs "−" given to the annular coils 22, 24, 26, 28 in FIG. 1 denote that these annular coils are the second annular coils.

Examples of the first and second electric supplying modules 41, 42 include controller units for controlling the electromagnet 20. In the present embodiment, the first electric current supplying module 41 supplies only the first electric current of the first and second electric currents, and the second electric current supplying module 42 supplies only the second electric current of the first and second electric currents. Moreover, in the present embodiment, the first electric current supplying module 41 supplies the first electric current to only the annular coils 21, 23, 25, 27 among the annular coils 21 to 28, and the second electric current supplying module 42 supplies the second electric current to only the annular coils 22, 24, 26, 28 among the annular coils 21 to 28. That is, in the present embodiment, the annular coils 21, 23, 25, 27 are exclusively used as the first annular coils through which the first electric current flows, and the annular coil 22, 24, 26, 28 are exclusively used as the second annular coils through which the second electric current flows.

In the treatment space 11a, the first magnetic field is generated by the annular coils 21, 23, 25, 27, and the second magnetic field is generated by the annular coils 22, 24, 26, 28. As a result, the first magnetic field and/or the second magnetic field is applied to the plasma in the treatment space 11a. The wafer 10 in the treatment chamber 11 is treated with the plasma.

The electromagnet 20 of the present embodiment includes the plurality of first annular coils (annular coils 21, 23, 25, 27) and the plurality of second annular coils (annular coils 22, 24, 26, 28) alternately. However, the annular coils 21 to 28 may be included in any other arrangement. For example, arrangement in which the annular coil 21 to 24 serve as the first annular coils and the annular coils 25 to 28 serve as the second annular coils may be adopted.

The controller 43 controls various operations of the semiconductor manufacturing apparatus. For example, the controller 43 controls timings for operating the first high-frequency power supply 14, the second high-frequency power supply 16, the first electric current supplying module 41, and the second electric current supplying module 42. Examples of the controller 43 include a processor, an electric circuit, and a computer.

The controller 43 of the present embodiment controls a timing for supplying the first electric current from the first electric current supplying module 41 to the first annular coils and a timing for supplying the second electric current from the second electric current supplying module 42 to the second annular coils. For example, the first electric current and the second electric current may be simultaneously supplied to the first annular coils and the annular coils, or the first electric current and the second electric current may be alternately supplied to the first annular coils and the second annular coils. This control is described in detail later.

Figure 2:
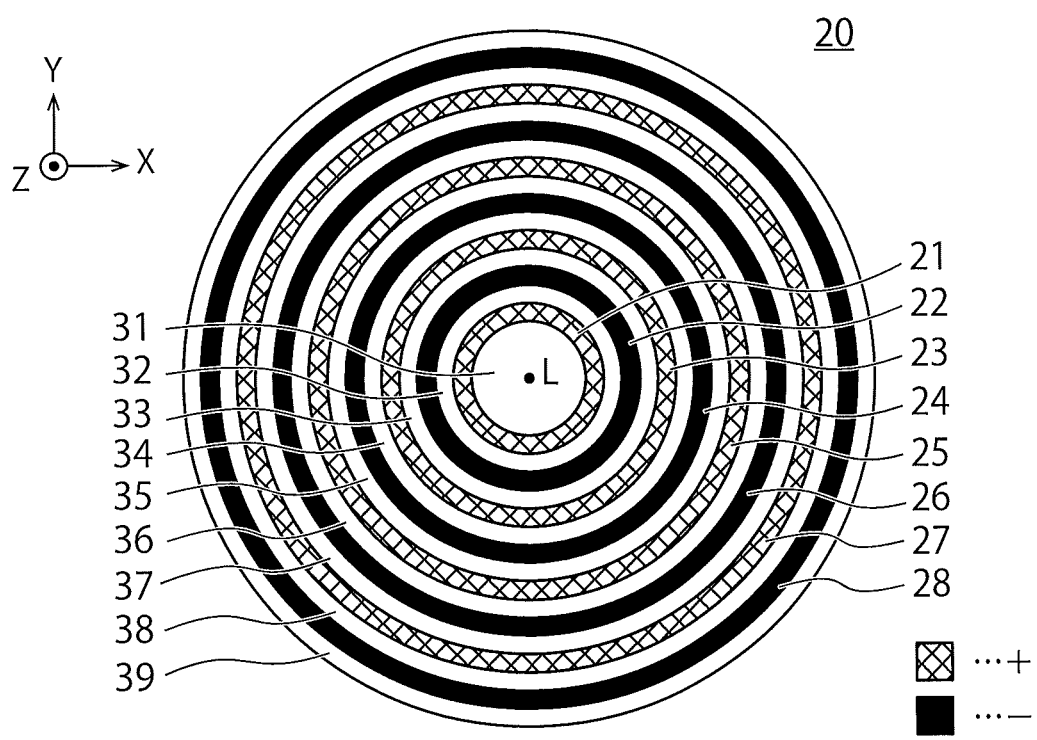
FIG. 2 is a plan view schematically showing the configuration of an electromagnet of the first embodiment.

FIG. 2 is a plan view schematically showing the configuration of the electromagnet 20 of the first embodiment.

As shown in FIG. 2, the electromagnet 20 of the present embodiment alternately includes the plurality of first annular coils (annular coils 21, 23, 25, 27) to which the first electric current flowing in the normal direction is supplied, and the plurality of annular coils (annular coils 22, 24, 26, 28) to which the second electric current flowing in the reverse direction is supplied.

Consequently, in the present embodiment, a normal magnetic field and a reverse magnetic field can be applied to the plasma. Accordingly, magnetic forces in two directions can be applied to the plasma. For example, in a case where a magnetic force in only one direction can be applied to plasma, extinction of the plasma due to collision of the plasma with a wall surface of the treatment chamber 11, etc. is difficult to inhibit. On the other hand, according to the present embodiment, magnetic forces in two directions are applied to the plasma so that movement of the plasma in the two directions is allowed. Consequently, motion of the plasma can be suppressed such that the plasma is less likely to collide with a wall surface of the treatment chamber 11, etc.

In this case, if, after the first electric current, the second electric current is subsequently supplied to a certain one of the annular coils, the relationship between the electric current in this annular coil and the magnetic field therefrom may be changed. For example, when a magnetic field H is generated by an electric current I at a first time point, a magnetic field H' ($\neq$H) may be generated by the electric current I at a second time point. As a result, appropriate control of motion of plasma becomes difficult.

One cause of change in the relationship between an electric current in an annular coil and a magnetic field therefrom is hysteresis of a material forming the electromagnet 20. In the present embodiment, since the core member 30 is formed of a ferromagnetic material, the hysteresis of the core member 30 has an influence on the relationship between the electric current in each of the annular coils and the magnetic field therefrom. The same applies to other members (e.g., the core of an annular coil) which are included in the electromagnet 20 and are formed of a ferromagnetic material.

Figure 3:
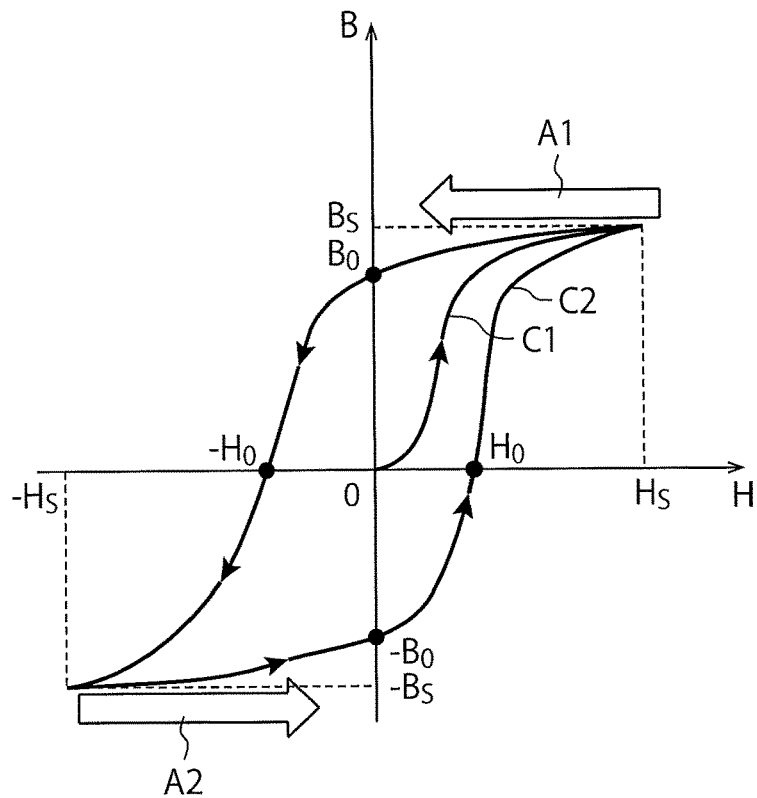
FIG. 3 is a graph for explaining the hysteresis of the electromagnet of the first embodiment.

FIG. 3 is a graph for explaining the hysteresis of the electromagnet 20 of the first embodiment.

In FIG. 3, the abscissa shows a magnetic field H, and the ordinate shows a magnetic flux density B. Reference character "C1" shows an initialization curve, and reference character "C2" shows a hysteresis curve. FIG. 3 further shows a holding force $H_0$, a residual magnetic flux density $B_0$, a saturation magnetic flux density $B_S$, and a magnetic field $H_S$ corresponding to the saturation magnetic flux density $B_S$.

Arrow A1 indicates that, when the magnetic flux density of a ferromagnetic material is $+B_S$, the magnetic field H to be applied to the ferromagnetic material is changed from a positive value to zero. In this case, when the magnetic field H becomes zero, the magnetic flux density becomes $+B_0$. On the other hand, arrow A2 indicates that, when the magnetic flux density of a ferromagnetic material is $-B_S$, the magnetic field H to be applied to the ferromagnetic material is changed from a negative value to zero. In this case, when the magnetic field H becomes zero, the magnetic flux density becomes $-B_0$.

Accordingly, when the magnetic field H is zero, the magnetic flux density in the case of arrow A1 is $+B_0$, whereas the magnetic flux density in the case of arrow A2 is $-B_0$. As a result, the case of arrow A1 and the case of arrow A2 do not match each other with respect to the relationship between the electric current in the annular coil and the magnetic field therefrom.

To this end, in the present embodiment, a normal magnetic field is generated exclusively by the annular coils (the first annular coils) for a normal magnetic field, whereas a reverse magnetic field is generated exclusively by the annular coils (the second annular coils) for a reverse magnetic field. Consequently, according to the present embodiment, the relationship between the electric current and the magnetic field in the case of arrow A1 may be used for the first annular coils, and the relationship between the electric current and the magnetic field in the case of arrow A2 may be used for the second annular coils. Accordingly, the annular coils can be caused to generate respective desired magnetic fields so that the motion of plasma can be appropriately controlled.

If, in the case of arrow A1, the magnetic field H is changed from a positive value to a negative value, and then, is changed from the negative value to zero, the magnetic flux density equal to that in the case of arrow A2 can be obtained. However, such control involves much waste of labor, and further, the plasma needs to be extinguished once. As a result, continuous discharge, which improves the throughput of in a semiconductor manufacturing step, cannot be carried out. This is not preferable for manufacturing of a semiconductor device. Therefore, the present embodiment adopts the method of separately using the first annular coils and the second annular coil.

The annular coils 21 to 28 of the present embodiment are disposed in a concentric circle shape, and the first annular coils and the second annular coils are alternately included. This configuration has an advantage that magnetic fields can be generated in a good symmetry, and the motion of plasma can be appropriately controlled. However, the configuration of the annular coils 21 to 28 of the present embodiment is not limited to the aforementioned one, and another configuration may be adopted. Moreover, the annular coils 21 to 28 of the present embodiment are disposed at equal intervals, but may be disposed at nonequal intervals.

The controller 43 of the present embodiment may simultaneously supply the first electric current and the second electric current to the first annular coils and the second annular coils, or may alternately supply the first electric current and the second electric current to the first annular coils and the second annular coils. In the latter case, for example, the motion of plasma can be caused in two directions alternately so that collision of the plasma can be effectively inhibited. On the other hand, in the former case, various motions of plasma can be caused by adjustment of the number of the first annular coils and the number of the second annular coils to be simultaneously driven, for example. The method of supplying the first electric current and the second electric current is not limited to the aforementioned one, another method may be adopted.

Figure 4:
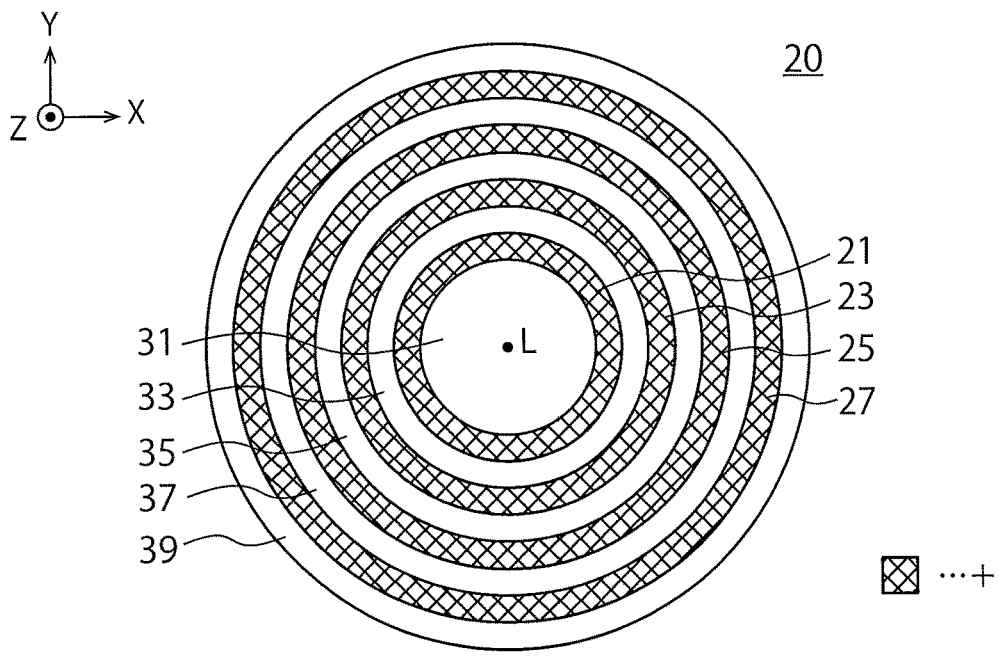
FIG. 4 is a plan view schematically showing the configuration of an electromagnet of a comparative example of the first embodiment.

FIG. 4 is a plan view schematically showing the configuration of the electromagnet 20 of a comparative example of the first embodiment.

The electromagnet 20 of the present comparative example includes only the annular coils 21, 23, 25, 27 which are the first annular coils. Consequently, in the present comparative example, both a normal magnetic field and a reverse magnetic field cannot be applied to plasma so that collision of the plasma with a wall surface of the treatment chamber 11, etc. is difficult to inhibit. On the other hand, if not only the first electric current but also the second electric current is supplied to the annular coils 21, 23, 25, 27, the aforementioned problem about the hysteresis arises.

According to the present embodiment, the first annular coils and the second annular coils are separately used, so that collision of plasma can be inhibited while the problem of hysteresis is addressed.

Figure 5:
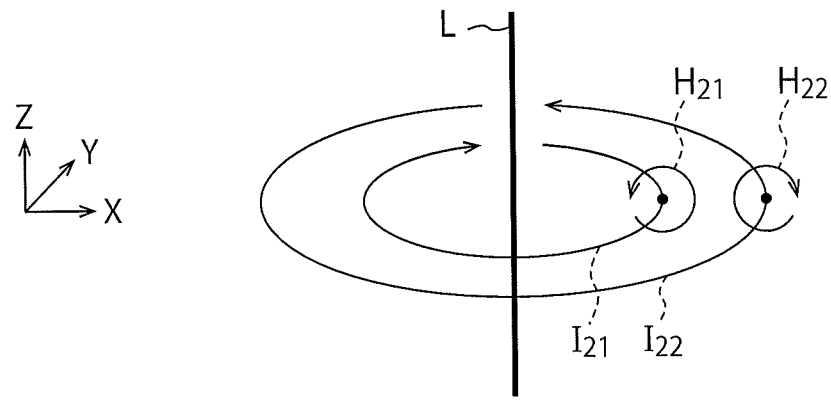
FIG. 5 is a perspective view for explaining an effect of the electromagnet of the first embodiment.

FIG. 5 is a perspective view for explaining an effect of the electromagnet 20 of the first embodiment.

FIG. 5 shows a first electric current $I_{21}$ which is supplied to the annular coil 21, a first magnetic field $H_{21}$ which is generated by the first electric current $I_{21}$, a second electric current $I_{22}$ which is supplied to the annular coil 22, and a second magnetic field $H_{22}$ which is generated by the second electric current $I_{22}$.

The first electric current $I_{21}$ flows clockwise when viewed from the +Z direction, and the second electric current $I_{22}$ flows counterclockwise when viewed from the +Z direction. Accordingly, the first and second magnetic fields $H_{21}$, $H_{22}$ shown in FIG. 5 are generated in mutually opposite directions. In the present embodiment, the direction of the first magnetic field $H_{21}$ is referred to as a normal direction, and the direction of the second magnetic field $H_{22}$ is referred to as a reverse direction. With use of the first and second magnetic fields $H_{21}$, $H_{22}$, collision of plasma can be inhibited.

Figure 6:
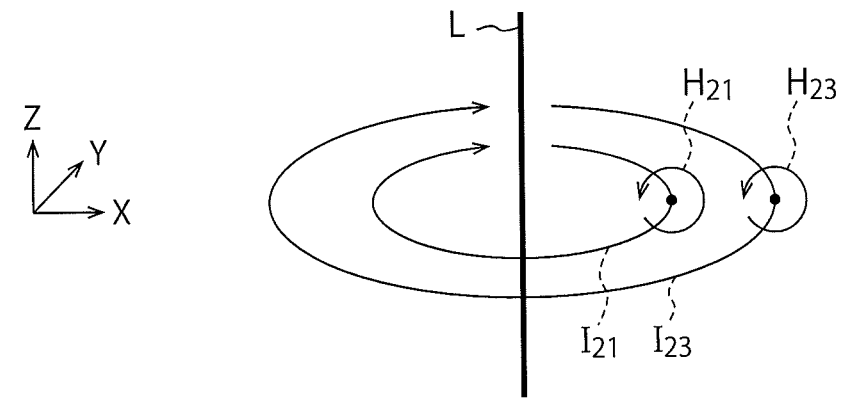
FIG. 6 is a perspective view for explaining an effect of the electromagnet of the comparative example of the first embodiment.

FIG. 6 is a perspective view for explaining an effect of the electromagnet 20 of the comparative example of the first embodiment.

FIG. 6 shows the first electric current $I_{21}$ which is supplied to the annular coil 21, the first magnetic field $H_{21}$ which is generated by the first electric current $I_{21}$, a first electric current $I_{23}$ which is supplied to the annular coil 23, and a first magnetic field $H_{23}$ which is generated by the first electric current $I_{23}$. In this case, collision of plasma with a wall surface of the treatment chamber 11, etc., is difficult to inhibit because a magnetic force only in one direction can be applied to the plasma.

As described above, the semiconductor manufacturing apparatus of the present embodiment includes one or more first annular coils (annular coils 21, 23, 25, 27) to which the first electric current flowing in the normal direction is supplied, and one or more second annular coils (annular coils 22, 24, 26, 28) to which the second electric current flowing in the reverse direction is supplied. Consequently, according to the present embodiment, while the relationship between electric current and magnetic fields is maintained, plasma can be appropriately controlled, for example, so that magnetic fields to be applied to the plasma can be appropriately controlled.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
   a treatment chamber configured to treat a substrate with plasma;
   a plurality of first annular coils forming electromagnets that are formed of materials exhibiting hysteresis regarding magnetism, disposed in a concentric circle shape, and configured to generate a first magnetic field to be applied to the plasma;
   a plurality of second annular coils forming electromagnets that are formed of materials exhibiting hysteresis regarding magnetism, disposed in a concentric circle shape with the plurality of first annular coils, alternately disposed with the plurality of first annular coils, and the plurality of second annular coils being configured to generate a second magnetic field to be applied to the plasma;
   a core member including a first portion that is provided in a most inner coil among the plurality of first annular coils and the plurality of second annular coils and has a columnar shape, a plurality of second portions that are provided between adjacent coils and around a most outer coil among the first and second annular coils and have cylindrical shapes, and a third portion that is provided on the first and second annular coils and the first and second portions and has a disk shape, the first portion, the plurality of second portions and the third portion being connected with one another to form one member;
   a first electric current supplying module configured to supply, only to the plurality of first annular coils among the plurality of first annular coils and the plurality of second annular coils, a first electric current flowing in a first direction, and cause the first annular coil to generate the first magnetic field;
   a second electric current supplying module configured to supply, only to the plurality of second annular coils among the plurality of first annular coils and the plurality of second annular coils, a second electric current flowing in a second direction that is different from the first direction, and cause the second annular coil to generate the second magnetic field; and
   a controller configured to control a timing for supplying the first electric current from the first electric current supplying module to the first annular coils, and a timing for supplying the second electric current from the second electric current supplying module to the second annular coils, the controller controlling the timings to simultaneously or alternately supply the first and second electric currents to the first and second annular coils.

2. The apparatus of claim 1, further comprising:
   a lower electrode provided in the treatment chamber and configured to support the substrate;
   an upper electrode provided in the treatment chamber and configured to face the lower electrode; and
   a power supply configured to supply electric power between the upper electrode and the lower electrode so as to generate the plasma in the treatment chamber.

3. The apparatus of claim 2, wherein the plurality of first annular coils and the plurality of second annular coils are provided above the upper electrode.

4. The apparatus of claim 2, comprising, as the power supply, a first power supply configured to supply electric power of a first frequency between the upper electrode and the lower electrode, and a second power supply configured to supply electric power of a second frequency that is different from the first frequency between the upper electrode and the lower electrode.

* * * * *